(12) United States Patent
Hotz et al.

(10) Patent No.: US 9,644,259 B2
(45) Date of Patent: May 9, 2017

(54) APPARATUS FOR COATING SUBSTRATES USING THE EB/PVD METHOD

(75) Inventors: Juergen Hotz, Muenster (DE); Pavel Seserko, Karlstein (DE); Joerg Wittich, Otzberg (DE); Helmut Eberhardt, Gruendau (DE); Manfred Kirschner, Michelstadt (DE); Wolfgang Rieth, Gelnhausen (DE)

(73) Assignee: ALD Vacuum Technologies GmbH, Hanau (DE)

( * ) Notice: Subject to any disclaimer, the term of this patent is extended or adjusted under 35 U.S.C. 154(b) by 582 days.

(21) Appl. No.: 13/642,086

(22) PCT Filed: Apr. 20, 2011

(86) PCT No.: PCT/DE2011/000434
§ 371 (c)(1),
(2), (4) Date: Oct. 18, 2012

(87) PCT Pub. No.: WO2011/131171
PCT Pub. Date: Oct. 27, 2011

(65) Prior Publication Data
US 2013/0032092 A1 Feb. 7, 2013

(30) Foreign Application Priority Data
Apr. 21, 2010 (DE) .......... 10 2010 017 895

(51) Int. Cl.
C23C 16/00 (2006.01)
C23C 14/24 (2006.01)
(Continued)

(52) U.S. Cl.
CPC ........... *C23C 14/246* (2013.01); *C23C 14/30* (2013.01); *H01J 37/20* (2013.01); *H01J 37/3053* (2013.01);
(Continued)

(58) Field of Classification Search
CPC .................................................. C23C 14/24
(Continued)

(56) References Cited

U.S. PATENT DOCUMENTS 3,313,474 A * 4/1967 Hamilton .................... 417/49
3,554,512 A * 1/1971 Elliott .................. C23C 14/243
118/726

(Continued)

FOREIGN PATENT DOCUMENTS

DE 10 2004 006 849 A1 9/2005
EP 0 535 019 B1 4/1993

OTHER PUBLICATIONS

English translation of DE 2004-006849, Hoffmann et al, Sep. 2005.*

(Continued)

*Primary Examiner* — Keath Chen
(74) *Attorney, Agent, or Firm* — Crowell & Moring LLP

(57) ABSTRACT

An apparatus for coating substrates with a coating material is disclosed. The apparatus includes a frame, a crucible arrangement including a first crucible and a second crucible disposed offset from one another in a horizontal plane, where the crucible arrangement is disposed on the frame. At least one first shaft is associated with the first crucible and at least one second shaft is associated with the second crucible, where the at least one first and second shafts are disposed in the frame beneath the first and second crucibles, respectively. A first lifting device is associated with the at least one first shaft and a second lifting device is associated with the at least one second shaft, where the first and second lifting devices are disposed in the frame. The frame is linearly displaceable in the horizontal plane.

10 Claims, 2 Drawing Sheets

(51) Int. Cl.
    *C23C 14/30*     (2006.01)
    *H01J 37/20*     (2006.01)
    *H01J 37/305*     (2006.01)

(52) U.S. Cl.
    CPC . *H01J 2237/202* (2013.01); *H01J 2237/3132* (2013.01)

(58) Field of Classification Search
    USPC .................................................. 118/726, 727
    See application file for complete search history.

(56) References Cited

U.S. PATENT DOCUMENTS

| | | | |
|---|---|---|---|
| 4,233,937 A * | 11/1980 | Steube | C23C 14/24 |
| | | | 118/50.1 |
| 5,037,262 A * | 8/1991 | Moll et al. | 414/222.04 |
| 5,324,552 A | 6/1994 | Opower et al. | |
| 6,300,225 B1 * | 10/2001 | Okamura et al. | 438/478 |
| 6,589,351 B1 * | 7/2003 | Bruce et al. | 118/726 |
| 2002/0005171 A1 * | 1/2002 | Hori | C23C 16/4411 |
| | | | 118/724 |
| 2007/0022955 A1 * | 2/2007 | Bender et al. | 118/726 |

OTHER PUBLICATIONS

PCT/ISA/237, dated Oct. 12, 2011, 6 pages total.
German Search Report w/Translation, dated Oct. 21, 2010, 8 pages total.
PCT/DE2011/000434 PCT/ISA/210, dated Oct. 12, 2011, 2 pages.
"Apparatus and Method for Coating Substrates Using the EB/PVD Method", filed Oct. 18, 2012, Inventor Juergen Hotz, et al.

* cited by examiner

APPARATUS FOR COATING SUBSTRATES USING THE EB/PVD METHOD

This application claims the priority of International Application No. PCT/DE2011/000434, filed Apr. 20, 2011, and German Patent Document No. 10 2010 017 895.0, filed Apr. 21, 2010, the disclosures of which are expressly incorporated by reference herein.

BACKGROUND AND SUMMARY OF THE INVENTION

The invention relates to an apparatus for coating substrates with a coating material using the EB/PVD method having a crucible arrangement comprised of at least two crucibles disposed offset from one another in a horizontal plane, which crucible arrangement is disposed in a frame that can be displaced horizontally, wherein at least one shaft for accommodating a material bar comprised of the coating material is disposed in the frame beneath each crucible, and having at least one lifting device, by means of which a material bar disposed in the shaft can be inserted through the base of the crucible into crucible, in order to be vaporized there by bombardment with an electron beam from an electron gun.

This type of arrangement is known. Two pairs of crucibles are disposed symmetrically on the head of a rotating base so that, by rotating the rotating base 180°, the crucibles of the one pair change places crosswise with the crucibles of the other pair. A carousel having several shafts, in which material bars are stockpiled, is situated beneath every crucible. Every material bar is made up of several short solid cylindrical segments. Once a material bar has been used up except for the last segment, said segment will get stuck in the crucible so that the carousel under the crucible is able to continue to rotate unhindered until a filled carousel shaft is again located under the crucible carousel. The lifting device pushes the new material bar against the segment remaining in the crucible, thereby releasing it from being stuck. Because the pushed-in material must correspond to the material of the remaining segment, a carousel is loaded with material bars made of one material.

The lifting device in the known apparatus is made of spindle drives, which are fastened on the wall of the vacuum chamber in which the apparatus is disposed.

Arranging a total of four crucibles with the associated carousels on a frame creates an arrangement, which, particularly in the case of a large load of material, is only able to be rotatably mounted on a vertical axis in a large installation space. The lifting devices disposed externally around the frame increase the installation space even more so that it is necessary to provide a large vacuum chamber.

The object of the invention is creating a compact system, which also operates in a trouble-free manner even when heavily loaded with material.

Therefore, to solve the problem, the invention provides that each crucible is assigned a lifting device, which is disposed in the frame, and that the frame can be displaced linearly in the direction of the offset of the crucible.

The advantage of the apparatus according to the invention is that a linear guidance with the same precision requires less installation space than a rotating arrangement so that it is also possible to dispose the lifting devices on the frame. They are thereby in a fixed spatial relationship with the carousels so that a precise interaction of the lifting device with the respectively associated carousel is ensured.

The carousels may now be filled with different materials for different substrate layers. The individual layers are applied successively, in that the frame is displaced linearly so that the respective crucible with the material that is currently to be vaporized is located in an operating position, where it can be reached by an electron beam. The location of the operating position is limited because large parts of the upper side of the frame with the crucible are located in the shadow of the substrates and their holders.

The problem of the shadow occurs because the electron gun is able to be disposed only above a coating zone, which lies above the crucibles and in which the to-be-coated substrates are situated. Because the substrates and their holders fill up the coating zone to a large extent, only a restricted space remains for guiding the electron beam to the crucibles. A substrate receptacle is made, for example, of two elongated, horizontally running holders, on which several substrates are held next to one another. Therefore, the electron beam is only able to move in a vertical plane, which lies between the two holders. Areas to the side of this plane are in the shadow of the substrate receptacles. For this reason, the individual crucibles must be pushed into the vertical plane to arrive at their operating position so that they can be reached by the electron beam.

If the frame is moved linearly from one end position into the other end position by a distance corresponding to the offset of the crucibles of a crucible arrangement, then the one crucible assumes the operating position of the other crucible so that said crucible can now be reached by the beam of the electron gun.

The crucible arrangement is preferably one of two crucible arrangements, wherein the crucibles of both crucible arrangements have the same offset so that in the operating position, material from each of the two crucibles is able to be vaporized.

In order to make sufficient material available without the vacuum chamber needing to be opened, each crucible is assigned a carousel having several shafts, wherein each carousel is rotatably mounted around a vertical axis in the frame.

A simple and compact design is achieved if the apparatus is disposed in a vacuum chamber, wherein the drive shafts for the lifting devices are fed through a wall of the vacuum chamber in a vacuum-tight manner so that the motors for driving the individual lifting devices are situated outside the vacuum chamber.

The motors are attached in a fixed manner on the vacuum chamber. So that it is possible to transmit torque to the lifting device in every position of the frame, every connection between a motor and the associated lifting device that transmits torque has a telescopically extendable section.

In the simplest case, the shafts are formed by cage bars arranged in a circle, which extend between an upper and lower rotary disk.

The lifting devices, which are configured as spindle drives, each have a laterally projecting extension, which engages in the associated shaft formed by cage bars.

In order to be able to switch between the shafts of a frame, a feed sleeve is disposed on the upper side of the frame for each crucible, through which a material bar can be inserted through the crucible base into the crucible. Each feed sleeve is equipped with a clamping device for holding the material bar in the feed sleeve.

The invention will be explained in more detail in the following on the basis of an exemplary embodiment.

DETAILED DESCRIPTION OF THE DRAWINGS

Figure 1:
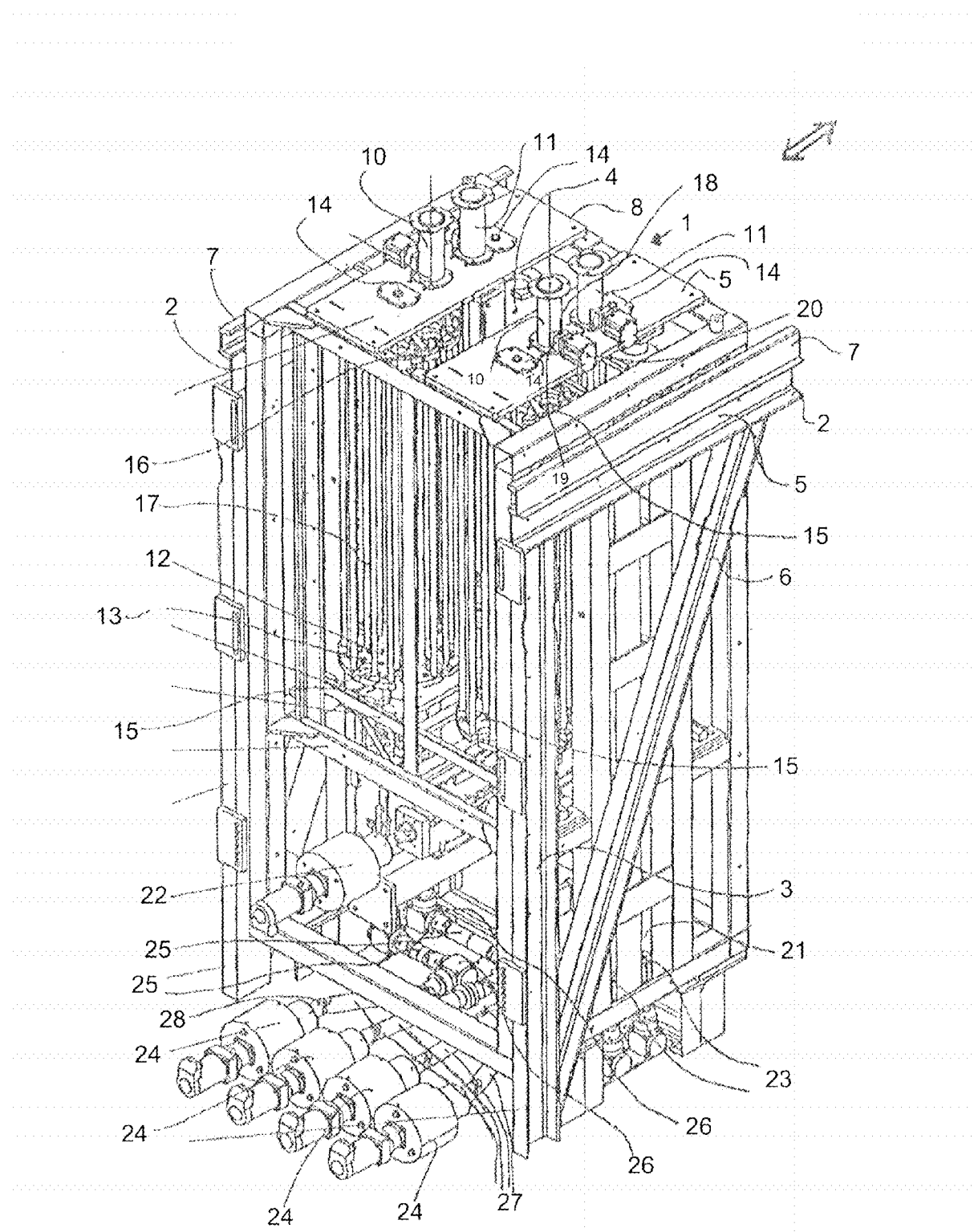
FIG. 1 is a general view of the apparatus, in which a frame with crucibles is situated in a forward position.

The arrangement according to the invention is made up of a frame 1 having a rectangular framework structure, which is disposed between two frame structures 2 so that it is linearly movable in the direction of the double arrow. Each frame structure is made up of a vertical bar 3, which is fastened over its length to a door (not shown here) of a vacuum chamber 4, and a crossbar 5, which sticks out from the door horizontally, and a support bar 6 that runs diagonally between the vertical bar 3 and the crossbar 5. There is a guide rail 7 on the upper side of the crossbar 5.

Two plates 8, 9 are screwed onto the upper side of the frame 1, on each of which a front and a rear guide sleeve 10, 11 are fastened. Front and rear crucibles (not shown in further detail here) for accommodating the material to be vaporized are situated on the guide sleeves 10, 11. Said material is inserted in the form of bars through the guide sleeves 10, 11 and through the base of the associated crucible from below into the crucible. A front and a rear crucible each form a crucible arrangement, wherein the crucibles of a crucible arrangement may be respectively loaded with different materials.

There is a condensation hood (not shown here) above the crucibles, which is likewise fastened to the door (not shown here) of the vacuum chamber. The condensation hood encloses a coating zone, in which the substrates are disposed on rotatable holders, which are also not shown in this case. The rotatable holders allow the substrates to rotate in a cloud of vapor so that they are coated on all sides.

Situated inside the frame 1, which is shown clearly in FIG. 1, beneath every guide sleeve 10, 11 is a carousel 12 having several shafts 13, in which the to-be-vaporized material is stockpiled in the form of material bars. The shafts 13 are disposed concentrically to a vertical axis 14 so that a shaft 13 of a frame 1 is always able to be placed under the respective associated guide sleeve 10, 11 or crucibles. The carousels 12 are each made up of an upper and a lower rotary disk 15, 16, between which cage bars 17 limiting the shafts 13 are disposed.

Every guide sleeve 10, 11 has a lateral opening 18, in which a clamp piece 19 can be inserted by means of a linear drive 20. This makes it possible to clamp a material bar in the guide sleeve 10, 11.

Situated in the side regions of the frame 1 are four lifting devices 21 (two on each side), which can be moved with the frame 1 and are respectively assigned to a carousel 12. Because both the carousels 12 as well as the lifting devices 21 are disposed on the frame 1, their spatial allocation is unchanged so that the lifting devices 21 are able to engage precisely in the shafts 13 to lift the material bars present there.

In order to be able to move the frame 1 back and forth, said frame has rollers on the upper edges, which are not shown in further detail here and which engage in the guide rails 7. The force for displacing the frame 1 is generated by a motor 22, which is fastened to the outside of a door of the vacuum chamber 4 and is connected to a spindle drive 23 that is fastened to the frame 1.

The lifting devices are also spindle drives, which are individually driven via other motors 24. These motors 24 are likewise attached externally on the door and are connected to the lifting devices 21 via several drive shafts 25 and diverters 26. So that the frame 1 is able to be moved with respect to the fixed motors 24, a drive shaft is respectively configured as a telescopic shaft 27, which connects directly to the respective motor 24 via cardan joints 28.

Figure 2:
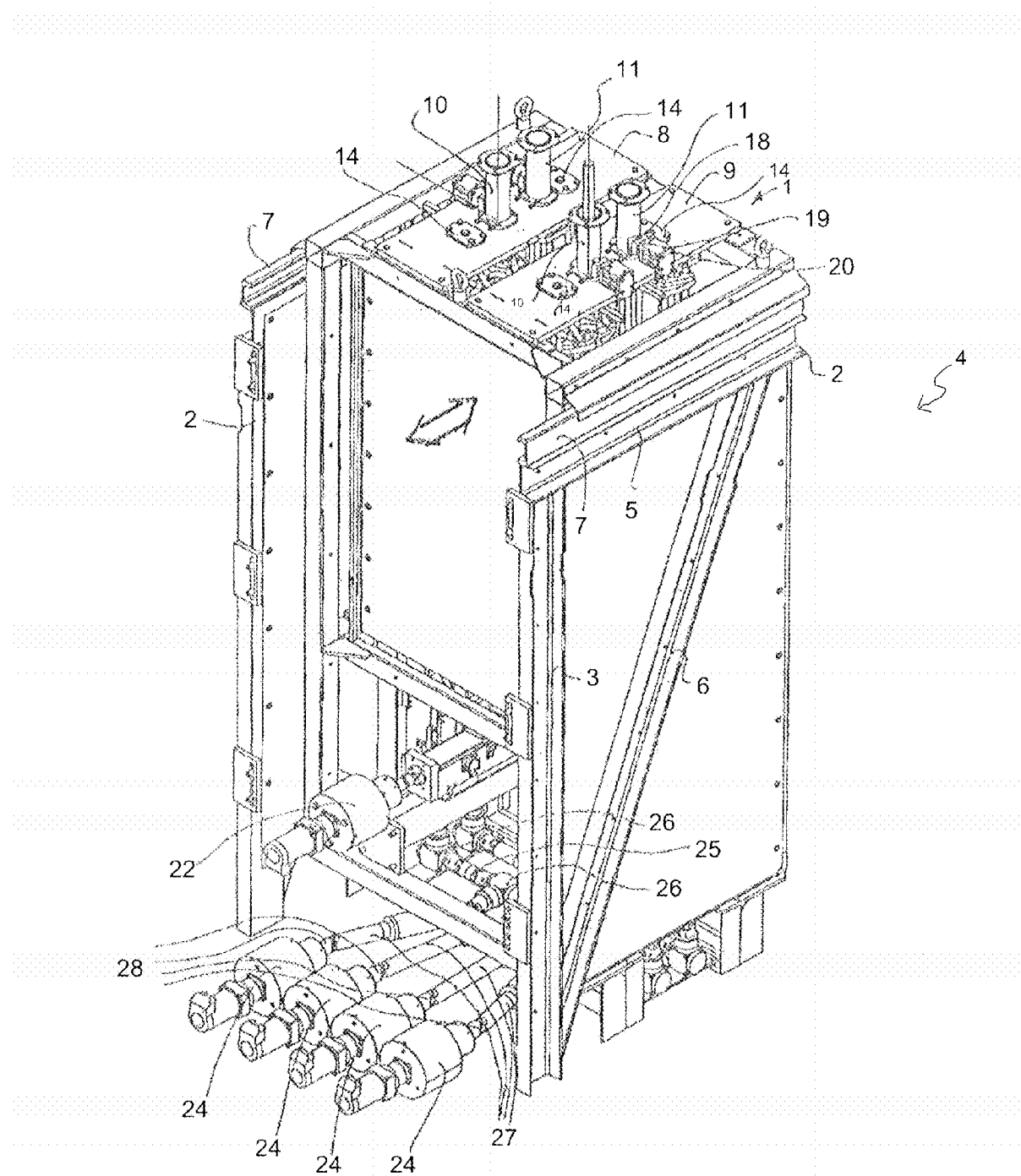
FIG. 2 is a general view of the same apparatus, in which the frame with crucibles is situated in a rear position.

FIG. 1 shows the frame 1 in a rear position, i.e., away from the door, and FIG. 2 shows the frame 1 in a front position, i.e., near the door. In the position depicted in FIG. 1, the two rear guide sleeves 11 and therefore the associated rear crucibles are situated in the operating positions.

In position of the frame near the door that is depicted in FIG. 2, the front crucibles are situated in the same operating position.

The crucibles, which are respectively situated in the operating positions, are able to be reached by the electron beams of the electron guns, which are situated above the frame structure.

The substrates are now able to be coated layer-by-layer with two different materials, which are each stockpiled in the carousels 12 for the front or rear crucibles. When changing to the next layer that is made of another material than the preceding one, the frame 1 is moved from the one position into the other end position so that the crucibles are situated in the operating position with the material that is now required.

The arrangement of two pairs of crucibles is necessary in order to create an extensive cloud of vapor in the coating zone in which a plurality of small substrates, e.g., turbine blades, is able to be coated simultaneously.

LIST OF REFERENCE NUMBERS

1 Frame
2 Frame structure
3 Vertical bar
4 Vacuum chamber
5 Crossbar
6 Support bar
7 Guide rail
8 Plate
9 Plate
10 Front guide sleeves
11 Rear guide sleeves
12 Carousel
13 Shafts
14 Vertical axis
15 Upper rotary disk
16 Lower rotary disk
17 Cage bars
18 Opening
19 Clamp pieces
20 Linear drive
21 Lifting devices
22 Motor
23 Spindle drive
24 Motors
25 Drive shafts
26 Diverter
27 Telescopic shafts
28 Cardan joints

The invention claimed is:
1. An apparatus for coating substrates with a coating material, comprising:
a frame internal to a vacuum chamber and mounted on a door that at least partially forms the vacuum chamber when closed;

a crucible arrangement including a first crucible and a second crucible disposed offset from one another in a horizontal plane, wherein the crucible arrangement is disposed on the frame;

an electron gun in the vacuum chamber, wherein an electron beam of the electron gun is directed to a point of impact on the horizontal plane;

at least one first shaft associated with the first crucible and at least one second shaft associated with the second crucible, wherein the at least one first and second shafts are disposed in the frame beneath the first and second crucibles, respectively; and a first lifting device associated with the at least one first shaft and a separate second lifting device associated with the at least one second shaft, wherein the first and second lifting devices are disposed in the frame and movable therewith;

wherein the frame is linearly displaceable internal to and in the horizontal plane of the vacuum chamber, whereby the displacement is a back and forth movement inside the vacuum chamber in the direction of the offset such that one of the crucibles is placed in the point of impact on the horizontal plane and the coating material in the crucible is vaporized when hit by the electron beam from the electron gun.

2. The apparatus according to claim 1, further comprising a second crucible arrangement disposed on the frame.

3. The apparatus according to claim 1, wherein the at least one first and second shafts are disposed on a first carousel and a second carousel, respectively, wherein the first and second carousels each include a plurality of shafts, and wherein the first and second carousels are each rotatably mounted around a respective vertical axis in the frame.

4. The apparatus according to claim 3, wherein the plurality of shafts of the first and second carousels are respectively arranged in a circle and extend between a respective upper and lower rotary disk of the first and second carousels.

5. The apparatus according to claim 4, wherein each of the frame structures has a crossbar, and wherein the frame is guided by rollers on the upper side of the crossbars.

6. The apparatus according to claim 1 in combination with a vacuum chamber, wherein the apparatus is disposed in the vacuum chamber, wherein a first drive shaft of the first lifting device and a second drive shaft of the second lifting device are disposed through a wall of the vacuum chamber in a vacuum-tight manner, and wherein a first motor associated with the first drive shaft and a second motor associated with the second drive shaft are disposed outside of the vacuum chamber.

7. The apparatus according to claim 6, wherein each of the first and second drive shafts are telescopic.

8. The apparatus according to claim 1, wherein the first and second lifting devices are spindle drives.

9. The apparatus according to claim 1, further comprising a first feed sleeve disposed on an upper side of the frame associated with the first crucible and a second feed sleeve disposed on the upper side of the frame associated with the second crucible, wherein the first and second feed sleeves each include a clamping device.

10. The apparatus according to claim 1, wherein the vacuum chamber has a housing with a door, wherein the frame structures are fastened to the door, and wherein the frame is guided on the upper side of the frame structures.

* * * * *